(12) United States Patent
Huang et al.

(10) Patent No.: US 12,048,211 B2
(45) Date of Patent: Jul. 23, 2024

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Can Huang, Hubei (CN); Wenxu Xianyu, Hubei (CN); Chunpeng Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/615,078

(22) PCT Filed: Nov. 11, 2021

(86) PCT No.: PCT/CN2021/130135
§ 371 (c)(1),
(2) Date: Nov. 29, 2021

(87) PCT Pub. No.: WO2023/077543
PCT Pub. Date: May 11, 2023

(65) Prior Publication Data
US 2024/0032354 A1 Jan. 25, 2024

(30) Foreign Application Priority Data
Nov. 2, 2021 (CN) .......................... 202111287529.2

(51) Int. Cl.
*H01L 23/00* (2006.01)
*H10K 59/131* (2023.01)
(Continued)

(52) U.S. Cl.
CPC ........... *H10K 59/131* (2023.02); *H10K 59/18* (2023.02); *H10K 59/95* (2023.02)

(58) Field of Classification Search
CPC ....... H10K 59/131; H10K 59/95; H10K 59/18
See application file for complete search history.

(56) References Cited

FOREIGN PATENT DOCUMENTS

| CN | 101377577 A | 3/2009 |
| CN | 107068710 A | 8/2017 |

(Continued)

OTHER PUBLICATIONS

International Search Report in International application No. PCT/CN2021/130135, mailed on Jun. 30, 2022.
(Continued)

*Primary Examiner* — Anthony Ho
(74) *Attorney, Agent, or Firm* — PV IP PC; Wei Te Chung; Zhigang Ma (57) ABSTRACT

The present application provides a display panel and a display device. The display panel includes a driving backplane and display components. A first binding terminal of each of the display components includes a first terminal portion and second terminal portions. One end of the second terminal portion is electrically connected to the first terminal portion, and the other end is electrically connected to the driving backplane. The second terminal portion is arranged in a dense and spaced columnar structure to alleviate an existing problem that display panel and motherboard have malfunction joints existing in the conventional seamless spliced display technologies.

20 Claims, 3 Drawing Sheets (51) Int. Cl.
*H10K 59/18* (2023.01)
*H10K 59/95* (2023.01)

(56) References Cited

FOREIGN PATENT DOCUMENTS

| | | |
|---|---|---|
| CN | 109887948 A | 6/2019 |
| CN | 111367125 A | 7/2020 |
| CN | 111584562 A | 8/2020 |
| CN | 111625113 A | 9/2020 |
| CN | 111681610 A | 9/2020 |
| CN | 111724742 A | 9/2020 |
| CN | 112820739 A | 5/2021 |
| WO | 2021147039 A1 | 7/2021 |

OTHER PUBLICATIONS

Written Opinion of the International Search Authority in International application No. PCT/CN2021/130135, mailed on Jun. 30, 2022.

DISPLAY PANEL AND DISPLAY DEVICE

FIELD OF INVENTION

This application relates to the fields of display technologies, and in particular to display panels and display devices.

BACKGROUND OF INVENTION

With the continuous development of display technologies, the applications of ultra large scale display screens is becoming more and more widespread, and the ultra large scale display screens can meet people's needs for long-distance viewing, larger information display, etc. For cost considerations, current ultra large scale display screens are usually implemented by splicing technology, and, that is, multiple sub-display screens are spliced to each other to form a ultra large scale display screen. However, when multiple display screens are spliced together, there will be large black splicing gaps at the seams, which seriously affects the display quality of the ultra large scale display screen. In order to solve the black splicing gaps at the seams, seamless spliced display technologies appear. Multiple display screens are spliced to each other and bound to a motherboard. This technology requires to configure binding terminals on each display screen to bind the motherboard. In order to achieve effective contact between the display screen and the motherboard, a film layer under the binding terminals is removed to completely expose the binding terminals by laser drilling. However, prolonged laser drilling damages the binding terminals and leads to malfunction joints between the display screen and the motherboard.

Therefore, the problem of malfunction joints between the display screen and the motherboard existing in the existing seamless splicing display technologies needs to be solved.

SUMMARY OF INVENTION

Technical Problem

The present application provides a display panel and a display device to alleviate the technical problem of malfunction joints between the display screen and the motherboard in an existing seamless splicing display technologies.

Technical Solutions

In order to solve the above problems, the technical solutions provided by the present application are as follows:

Embodiments of the present application provide a display panel, including a driving backplane, and a plurality of display components electrically connected to the driving backplane, wherein the display components include:

a substrate provided facing the driving backplane; and a plurality of first binding terminals, each of the first binding terminals including a first terminal portion and a plurality of second terminal portions, wherein the first terminal portion is provided at a side of the substrate away from the driving backplane, and the second terminal portions are provided in the substrate;

wherein one end of each of the second terminal portions is electrically connected to the first terminal portion, the other end of each of the second terminal portions is electrically connected to the driving backplane, and an orthographic projection area of the second terminal portions projected on the substrate is smaller than an orthographic projection area of the first terminal portion projected on the substrate.

In the display panel provided by the embodiments of the present application, the substrate includes a first substrate and a first barrier layer provided at a side of the first substrate away from the driving backplane, wherein the first terminal portion is provided at a side of the first barrier layer away from the first substrate, the second terminal portions are provided in the first barrier layer, and the first substrate is provided with an opening corresponding to the first terminal portion.

In the display panel provided by the embodiments of the present application, the first barrier layer is provided with a plurality of through holes at intervals in an area corresponding to the first terminal portion, and each of the second terminal portions is filled in a corresponding through hole.

In the display panel provided by the embodiments of the present application, a size of the through hole ranges from 2 microns to 5 microns.

In the display panel provided by the embodiments of the present application, a size of the opening is greater than or equal to a size of the first terminal portion.

In the display panel provided by the embodiments of the present application, the size of the first terminal portion is greater than 100 microns.

In the display panel provided by the embodiments of the present application, the display components further include a driving circuit layer provided at a side of the first binding terminal away from the substrate, and the driving circuit layer includes a plurality of signal traces electrically connected to a corresponding first terminal portion.

In the display panel provided by the embodiments of the present application, the substrate further includes an insulating protection layer covering the first terminal portion and the first barrier layer, and the driving circuit layer includes:

a semiconductor layer provided on the insulating protection layer;

a gate insulating layer covering the semiconductor layer and the insulating protection layer;

a gate electrode layer provided on the gate insulating layer, and the gate electrode layer including a gate electrode and a gate signal scanning line;

an interlayer insulating layer covering the gate electrode layer and the gate insulating layer; and a source electrode and drain electrode layer disposed on the interlayer insulating layer, and the source electrode and drain electrode layer including a source electrode, a drain electrode and a data line;

the signal traces include gate signal line and the data line.

In the display panel provided by the embodiments of the present application, the first terminal portion and the second terminal portions are integrally provided as a whole.

In the display panel provided by the embodiments of the present application, a second binding terminal is provided at a side of the driving backplane facing the display components, and the second binding terminal is electrically connected to the second terminal portion.

In the display panel provided by the embodiments of the present application, a number of the display components is multiple, and the display components are arranged on the driving backplane in an array.

The embodiments of the present application further provides a display device, including a casing and one of foregoing embodiments of the display panel, the casing formed with an accommodating cavity, and the display panel arranged within the accommodating cavity.

Beneficial Effect

The present application provides display panels and display devices in which a plurality of display components are arranged in an array on a driving backplane, each of the display components including a substrate and a plurality of first binding terminals, each of the first binding terminals including a first terminal portion and a plurality of second terminal portions, the first terminal portion provided at a side of the substrate away from the driving backplane, the second terminal portions provided within the substrate, one end of each of the second terminal portions electrically connected to the first terminal, and the other end of each of the second terminals electrically connected to the driving backplane, and an orthographic projection area of the second terminals projected on the substrate is smaller than an orthographic projection area of the first terminal projected on the substrate. The second terminal portion is arranged in a dense and spaced columnar structure, which reduces the damage to the second terminals during the laser drilling and improves the reliability of binding the first binding terminal to the driving backplane, thus solving the problem that the display screen and the motherboard have malfunction joints existing in the conventional seamless spliced display technologies.

DRAWINGS

In order to more clearly explain the embodiments or the technical solutions in the conventional art, the following will briefly introduce the drawings that need to be used in the description of the embodiments or the conventional art. It is apparent that the drawings in the following description are only some embodiments of the application. For those of ordinary skill in the art can obtain other drawings based on these drawings without any creative work.

DETAILED DESCRIPTION OF EMBODIMENTS

The description of the following embodiments refers to the accompanying drawings to illustrate specific embodiments that can be implemented in the present application. The directional terms mentioned in this application, such as "upper", "lower", "front", "rear", "left", "right", "inside", "outside", "side" etc., are merely refer to the direction of the accompanying drawing. Therefore, the directional terms used are used to illustrate and understand the present application, rather than to limit the present application. In the drawings, elements with similar structures are indicated by the same reference numerals. In the accompanying drawings, the thickness of some layers and areas is exaggerated for clarity of understanding and ease of description. That is, the dimensions and thickness of each component illustrated in the accompanying drawings are arbitrarily shown, but the present application is not limited thereto.

Figure 1:
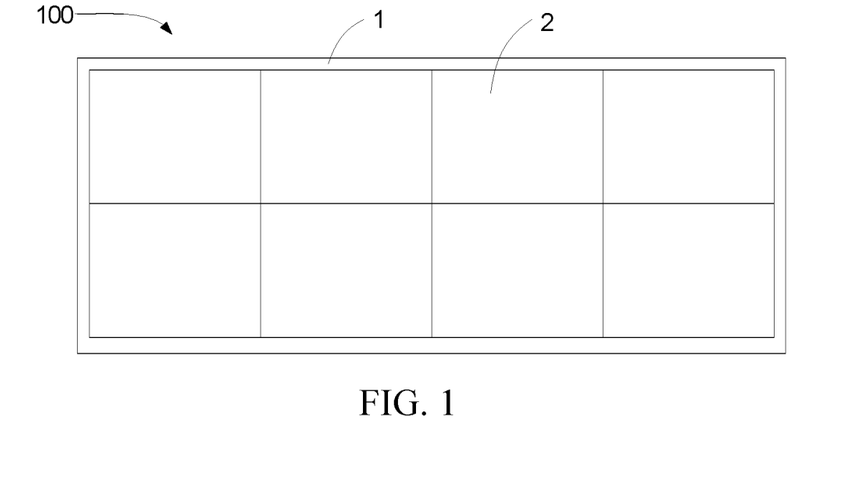
FIG. 1 is a schematic top structural view of a display panel provided by an embodiment of the present application.
Figure 2:
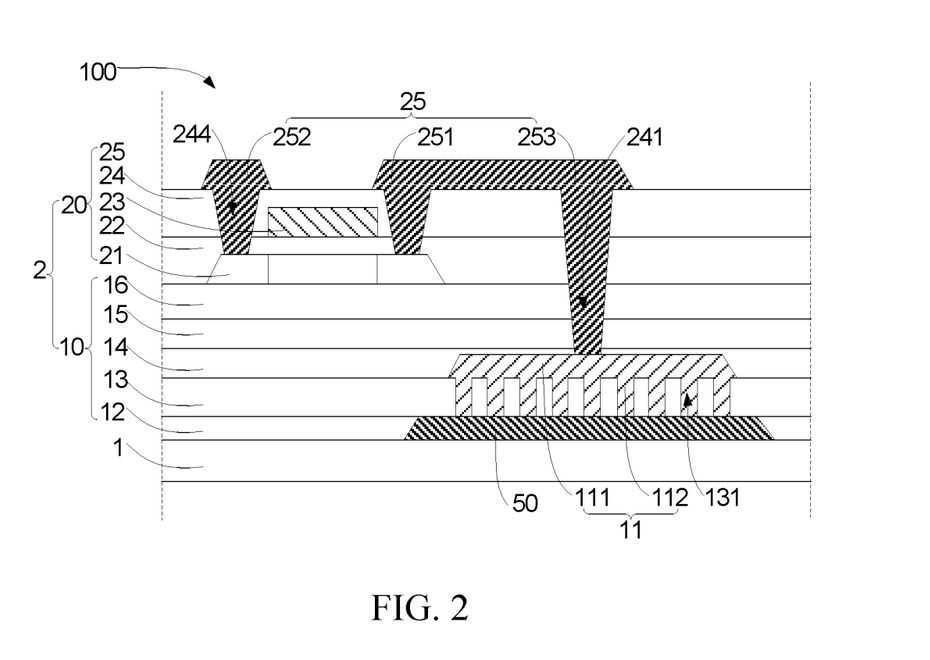
FIG. 2 is a schematic partial sectional structural view of a display panel provided by an embodiment of the present application.
Figure 3:
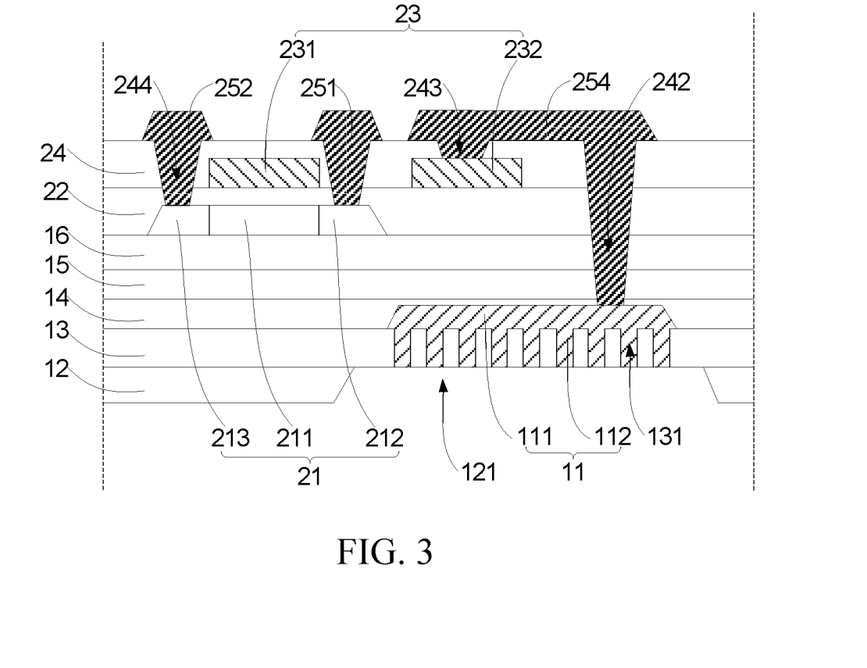
FIG. 3 is a first schematic partial sectional structural view of display components provided by an embodiment of the present application.

Refer to FIG. 1 to FIG. 3. FIG. 1 is a schematic top structural view of a display panel provided by an embodiment of the present application, FIG. 2 is a schematic partial sectional structural view of a display panel provided by an embodiment of the present application, FIG. 3 is a first schematic partial sectional structural view of display components provided by an embodiment of the present application. The display panel 100 includes a driving backplane 1 and a plurality of display components 2 arranged in an array on the driving backplane 1. Each of the display components 2 includes a substrate 10 provided facing the driving backplane 1 and a plurality of first binding terminals 11. Each of the first binding terminals 11 includes a first terminal portion 111 and a plurality of second terminal portions 112, the first terminal portion 111 is provided at a side of the substrate 10 away from the driving backplane 1, and the second terminal portions 112 are provided within the substrate 10. An orthographic projection area of the second terminal portions 112 projected on the substrate 10 is smaller than an orthographic projection area of the first terminal portion 111 projected on the substrate 10.

One end of each of the second terminals 112 is electrically connected to the first terminal 111, and the other end of each of the second terminal 112 is electrically connected to the driving backplane 1, so that each of the display components 2 is electrically connected to the driving backplane 1 through the first binding terminals 11. Furthermore, each of the display components 2 also includes a plurality of signal lines (such as a data line 253 shown in FIG. 2 and the gate scanning line 232 shown in FIG. 3) provided at a side of the first binding terminals 11 away from the driving backplane 1. Each signal line is electrically connected to a corresponding first binding terminal 11. More specifically, each signal line is electrically connected to the first terminal portion 111 of the corresponding first binding terminal 11 to enable the driving backplane 1 to provide a signal to the corresponding signal line through the first binding terminal 11.

A film structure of the display components 2 will be described in detail below.

Specifically, the substrate 10 also includes a first substrate 12 and a first barrier layer 13 stacked, the first substrate 12 is provided facing the driving backplane 1, the first barrier layer 13 is provided at a side of the first substrate 12 away from the driving backplane 1, and the first terminal portion 111 is provided at a side of the first barrier layer 13 away from the first substrate 12. The second terminal portion 112 is provided within the first barrier layer 13, and the first substrate 12 is provided with an opening 121 in an area corresponding to the first binding terminal 11 to expose the second terminal portions 112 for electrical connection with the driving backplane 1.

Optionally, the opening 121 on the first substrate 12 can be formed by laser drilling, and a size of the opening 121 is greater than or equal to a size of the first terminal portion 111 to make the first binding terminal 11 effective contact with the driving backplane 1. Certainly, the present application is not limited to the above embodiments, and the size of the opening 121 of the present application may also be smaller than the size of the first terminal portion 111.

Optionally, the size of the first terminal portion 111 is greater than 100 microns, so that a contact area between the first binding terminal 11 and the driving backplane 1 is large enough to improve the stability of the binding between the first binding terminals 11 and the driving backplane 1. The size of the first terminal portion 111 refers to a diameter or side length of the first terminal portion 111, which depends on a cross-sectional shape of the first terminal portion 111. The cross-sectional shape of the first terminal portion 111 in the present application includes circle, square, etc. Assuming the cross-sectional shape of the first terminal portion 111 is circular, the size of the first terminal portion 111 refers to a diameter of the first terminal portion 111. Assuming the cross-sectional shape of the first terminal portion 111 is square, the size of the first terminal portion 111 refers to a side length of the first terminal portion 111. The definition of the size of the opening 121 is same as that of the first terminal portion 111, which depends on a cross-sectional shape of the opening 121, and the cross-sectional shape of the opening 121 is related to the cross-sectional shape of the first terminal portion 111.

Optionally, the first barrier layer 13 is provided with a plurality of through holes 131 at intervals in an area corresponding to the first terminal portion 111, and each of the second terminal portions 112 is filled in a corresponding through holes 131, so that the second terminal portions 112 are provided in in a dense and spaced columnar structure arrangement. Namely, the second terminal portions 112 are in a pin structure, so that an orthographic projection area of the second terminal portions 112 projected on the substrate 10 is smaller than an orthographic projection area of the first terminal portion 111 projected on the substrate 10. By arranging the first terminal portion 111 in a dense and spaced columnar structure, when the opening 121 is formed on the first substrate 12 by laser drilling, the damage caused by the laser to the first binding terminal 11 can be reduced, so as to improve the binding reliability between the first binding terminal 11 and the driving backplane 1, avoid the malfunction joints between the display components 2 and the driving backplane 1, so as to solve the problem that display the screen and the motherboard have malfunction joints existing in the conventional seamless spliced display technologies.

Optionally, a size of the through hole 131 ranges from 2 microns to 5 microns. Because the second terminal portions 112 are filled in the through holes 131, the size of the through hole 131 is also the size of each of the second terminal portions 112. The size of each of the second terminal portions 112 is smaller than the size of the first terminal portion 111. Therefore multiple second terminal portions 112 can be configured at an area corresponding to the first terminal portion 111. A greater number of the second terminal portions 112 may facilitate to reduce the damage caused by laser to the first binding terminal 11.

The size of the through hole 131 refers to a diameter or side length of the through hole 131, which depends on a cross-sectional shape of the through hole 131. The cross-sectional shape of the through hole 131 in the present application includes circular, square, etc. Assuming the cross-sectional shape of the through hole 131 is circular, the size of the through hole 131 refers to a diameter of the through hole 131. Assuming the cross-sectional shape of the through hole 131 is square, the size of the through hole 131 refers to a side length of the through hole 131. It can be understood that when the cross-sectional shape of the through hole 131 is circular, an inner surface of the through hole 131 is smoother. In this way, when a conductive metal is filled in the through hole 131 to form the second terminal portion 112, the preparation of the second terminal portion 112 is further facilitated.

Optionally, the first terminal portion 111 and a plurality of second terminal portions 112 are integrally configured as a whole to form the first binding terminal 11. The first binding terminal 11 can be prepared by a metal or alloy with strong anti-oxidation and low resistivity, such as Mo, Al alloy, etc., to ensure the stability of the first binding terminal 11 and the reliability of connection with the driving backplane 1.

Optionally, the substrate 10 further includes an insulating protection layer covering the first terminal portion 111 and the first barrier layer 13. The insulating protection layer may include a second substrate 14 covering the first terminal portion 111 and the first barrier layer 13, and a second barrier layer 15 covering the second substrate 14, and a buffer layer 16 covering the second barrier layer 15. The first barrier layer 13, the second barrier layer 15 and the buffer layer 16 can be formed of inorganic materials such as silicon oxide (SiOx), silicon nitride (SiNx) and silicon oxynitride (SiON) to prevent the diffusion of undesired impurities or contaminants (e.g., moisture, oxygen, etc.) from the first substrate 12 and the second substrate 14 into components that may be damaged by such impurities or contaminants. Certainly, the substrate of the present application is not limited to the above embodiments, and the substrate 10 of the present application may include more or fewer layers of the inorganic film layer. Materials of the first substrate 12 and the second substrate 14 include flexible film materials such as polyimide (PI). Furthermore, the buffer layer 16 can also provide a planar top surface to facilitate the preparation of other film structures on the substrate 10.

Specifically, each of the display components 2 also includes a driving circuit layer 20 provided at a side of the substrate 10 away from the driving backplane 1, and the driving circuit layer 20 includes a plurality of the signal lines.

Optionally, the driving circuit layer 20 includes a semiconductor layer 21, a gate insulating layer 22, a gate electrode layer 23, an interlayer insulating layer 24 and a source electrode and drain electrode layer 25. The semiconductor layer 21 is provided on the substrate 10, more specifically, the semiconductor layer 21 is provided on the buffer layer 16 of the insulating protection layer. The semiconductor layer 21 includes a channel region 211, a source region 212 and a drain region 213, the source region 212 and the drain region 213 are located at opposite sides of the channel region 211. The gate insulating layer 22 is covered on the semiconductor layer 21 and the substrate 10. The gate electrode layer 23 is provided on the gate insulating layer 22, the gate electrode layer 23 is patterned to form a gate electrode 231 and other signal lines such as a gate scanning line 232, the gate electrode 231 is provided corresponding to the channel region 211 of the semiconductor layer 21, and the gate scanning line 232 is electrically connected with the corresponding first terminal portion 111. The interlayer insulating layer 24 is covered on the gate electrode layer 23 and the gate insulating layer. The source electrode and drain electrode layer 25 is provided on the interlayer insulating layer 24, and the source electrode and drain electrode layer 25 is patterned to form other signal lines, such as active electrode 251, drain electrode 252 and data line 253. The source electrode 251 and the drain electrode 252 are electrically connected to the source region 212 and drain region 213 which is corresponding to the semiconductor layer 21 respectively, and the data line 253 is electrically connected to the corresponding first terminal portion 111. The signal lines of the driving circuit layer 20 include the gate scanning line 232 and the data line 253, and different signal lines are electrically connected with the different first terminal portions 111.

Specifically, the interlayer insulating layer 24 is patterned to form a first via 241, which penetrates through the interlayer insulating layer 24, the gate insulating layer 22, the buffer layer 16, the second barrier layer 15, and the second substrate 14 to the first terminal portion 111 to expose a portion of the first terminal portion 111. The data line 253 is electrically connected to the first terminal 111 through the first via 241, and the data line 253 is also electrically connected with the source electrode 251 or the drain electrode 252. The present application takes the electrical connection between the data line 253 and the source electrode 251 as an example.

Furthermore, the interlayer insulating layer 24 is patterned to form a second via 242 and a third via 243. The structures of the second via 242 and the first via 241 are same. Namely, the second via 242 also penetrates through the interlayer insulating layer 24, the gate insulating layer 22, the buffer layer 16, the second barrier layer 15, and the second substrate 14 to the first terminal portion 111, so as to partially expose the first terminal portion 111. The third via 243 penetrates the interlayer insulating layer 24 to the gate scanning line 232, so as to partially expose the gate scanning line 232. The source electrode and drain electrode layer 25 further includes a signal transfer line 254 provided on same layer as the data line 253. The signal transfer line 254 is electrically connected with the first binding terminal 11 and the gate scanning line 232 through the second via 242 and the third via 243 respectively, so that the gate scanning line 232 is electrically connected with the first terminal portion 111.

Furthermore, the interlayer insulating layer 24 is patterned to form a plurality of fifth vias 244, and the fifth vias 244 penetrate through the interlayer insulating layer 24 and the gate insulating layer 22 to expose the source region 212 and the drain region 213 respectively. The source electrode 251 is electrically connected to the source region 212 through one of the fifth vias 244, and the drain electrode 252 is electrically connected to the drain region 213 through another of the fifth vias 244.

It should be noted that the phrase "provided on same layer" in the present application refers to, in the preparation process, the film layer formed by same material is patterned to obtain at least two different features, then the at least two different features are configured in same layer. For example, the signal transfer line 254 and the data line 253 in this embodiment are obtained by patterning a same conductive film layer, then the signal transfer line 254 and the data line 253 are provided on same layer.

In addition, in the present application, the signal lines of the driving circuit layer 20 are not limited to the data lines 253 and the gate scanning lines 232, the signal lines may also include VSS, VDD power lines and other various signal lines for displaying or non-displaying, and different signal lines are electrically connected with different first terminal portions 111. Namely, different signal lines are electrically connected with different first binding terminals 11 to obtain different signals. For example, the data line 253 is electrically connected to a corresponding first binding terminal 11 to obtain a source driving signal and provide it to the source electrode 251. The gate scanning line 232 is electrically connected to a corresponding first binding terminal 11 to obtain a gate scanning signal and provide it to the gate electrode 231.

Furthermore, in order to provide a planar surface for the driving circuit layer 20, the driving circuit layer 20 further includes a planar layer 26 covering the source electrode and drain electrode layer 25 and the interlayer insulating layer 24. Certainly, the structure of the driving circuit layer 20 in the present application is not limited to that illustrated in this embodiment, the driving circuit layer 20 of the present application may also include more or fewer film layers, and the positional relationship of each film layer is not limited to that illustrated in this embodiment. For example, the gate electrode layer 23 of the present application may also modify into a double gate structure, and the gate layer 23 may further be located below the semiconductor layer 21 to form a bottom gate structure.

Figure 4:
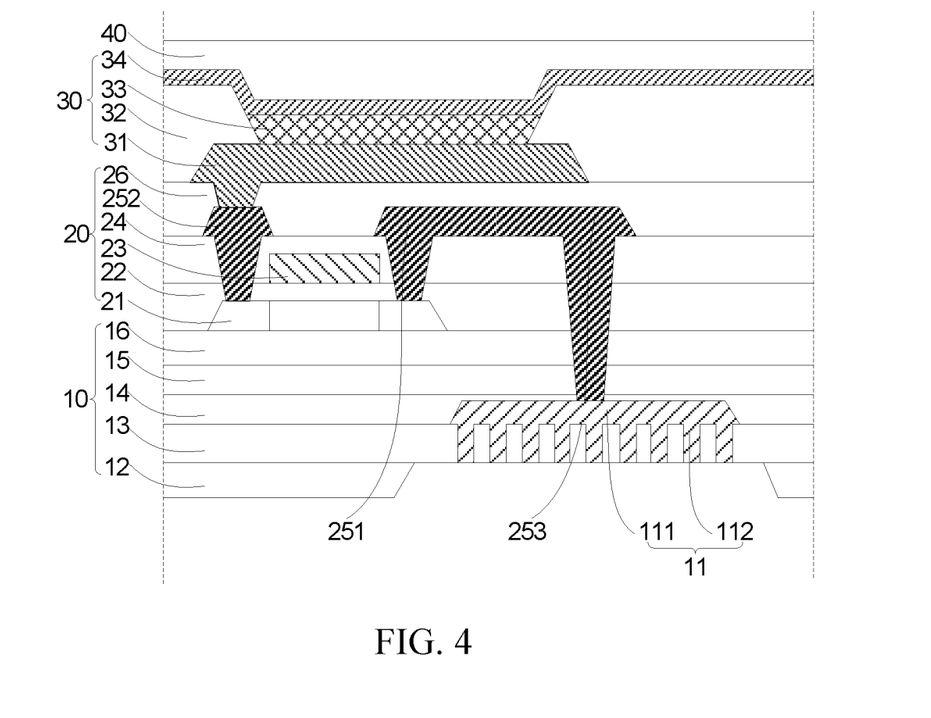
FIG. 4 is a second schematic partial sectional structural view of display components provided by an embodiment of the present application.

Understandably, refer to FIG. 1 to FIG. 4 in combination. FIG. 4 is a second schematic partial sectional structural view of display components provided by an embodiment of the present application. In order to realize the display function of the display components 2, the display components 2 further include a light-emitting functional layer 30 provided on the driving circuit layer 20, the driving circuit layer 20 is used to provide a driving voltage to the light-emitting functional layer 30 to cause the light-emitting functional layer 30 to emit light. In order to protect the light-emitting functional layer 30, ensure the reliability of the light-emitting functional layer 30, and avoid the failure of the light-emitting functional layer 30 caused by moisture and oxygen invasion, the display components 2 further includes a encapsulation layer 40.

Specifically, the light-emitting functional layer 30 includes a pixel electrode 31, a pixel definition layer 32, a light-emitting unit 33, and a cathode 34. The pixel electrode 31 is provided on the planar layer 26 and is electrically connected to the source electrode 251 or the drain electrode 252 through the vias of the planar layer 26. Certainly, because this embodiment takes the electrical connection between the data line 253 and the source electrode 251 as an example, correspondingly, this embodiment takes the electrical connection between the pixel electrode 31 and the drain electrode 252 as an example. The pixel definition layer 32 is provided on the pixel electrode 31 and the planar layer 26, and the pixel definition layer 32 is patterned to form a pixel opening, the pixel opening exposes a portion of the pixel electrode 31 to define the setting area of the light-emitting unit 33.

The light-emitting unit 33 is formed of light-emitting materials printed in the pixel opening of the pixel definition layer 32, and the light-emitting materials with different colors form different color light-emitting units 33. For example, the light-emitting units 33 may include a red light-emitting unit formed of a red light-emitting material, a green light-emitting unit formed of a green light-emitting material, a blue light-emitting unit formed of a blue light-emitting material. The red light-emitting unit emits red light, the green light-emitting unit emits green light, and the blue light-emitting unit emits blue light.

The cathode 34 covers the light emitting unit 33 and the pixel definition layer 32. The light-emitting unit 33 emits light under the joint action of the pixel electrode 31 and the cathode 34, and the different color light-emitting units 33 emit light with different colors, so as to achieve the pixel display of the display components 2.

Optionally, the pixel electrode 31 may be a transparent electrode or a reflective electrode. Assuming the pixel electrode 31 is a transparent electrode, the pixel electrode 31 may be formed of, for example, indium tin oxide (ITO), indium zinc oxide (IZO), ZnO or In2O3. Assuming the pixel electrode 31 is a reflective electrode, the pixel electrode 31 may include, for example, a reflective layer formed of Ag, Mg, Al, Pt, Pd, Au, Ni, Nd, Ir, Cr or a combination thereof and a layer formed of ITO, IZO, ZnO or In2O3. However, the pixel electrode 31 is not limited to above embodiments. The pixel electrode 31 may be formed of various materials and may also be formed into a single-layer or multi-layers structure.

It should be noted that whether the pixel electrode 31 uses a transparent electrode or a reflective electrode, it depends on the light output direction of the display panel 100. Assuming the display panel 100 uses top light emission type, the pixel electrode 31 can be a transparent electrode or a reflective electrode. Certainly, when the reflective electrode is used, the utilization of the light emitted by the light emitting unit 33 can be improved. Assuming the display panel 100 uses bottom light emission type, the pixel electrode 31 uses a transparent electrode to improve the transmittance of light. This embodiment is illustrated by the use of top light emission type for the display panel 100, in order to improve the light transmittance, the cathode 34 requires to be formed by using a transparent conductive material. For example, the cathode 34 may be composed of a transparent conductive oxide such as ITO, IZO, ZnO or In2O3.

Optionally, the light-emitting function layer 30 may also include a hole injection layer (HIL) and a hole transport layer (HTL) provided between the light emitting unit 33 and the pixel electrode 31, and an electron injection layer (EIL) and an electron transport layer (ETL) provided between the light emitting unit 33 and the cathode 34. The hole injection layer receives the holes transmitted by the pixel electrode 31, the holes are transmitted to the light emitting unit 33 through the hole transport layer, the electron injection layer receives the electrons transmitted by the cathode 34, and the electrons are transmitted to the light emitting unit 33 through the electron transport layer. The holes and electrons combine at the position of the light emitting unit 33 to generate excitons, which transition from the excited state to the ground state to release energy and emit light.

The encapsulation layer 40 covers the light emitting functional layer 30 and is used to protect the light emitting unit 33 of the light emitting functional layer 30 from the failure of the light emitting unit 33 caused by the invasion of moisture and oxygen. Optionally, the encapsulation layer 40 may use thin film encapsulation. For example, the encapsulation layer 40 may be a laminated structure formed by sequentially stacking three films of a first inorganic encapsulation layer, an organic packaging layer, and a second inorganic encapsulation layer, or a laminated structure of more layers.

In this embodiment, the display panel 100 includes a driving backplane 1 and a plurality of display components 2 arranged in an array on the driving backplane 1, namely, the display components 2 are spliced and bound to the driving backplane 1. The signal lines of each of the display components 2 are electrically connected with the driving backplane 1 through different first binding terminals 11. Specifically, the driving backplane 1 is provided with a second binding terminal 50 at an area that the first binding terminal 11 corresponds to each of the display components 2, and the second binding terminal 50 is electrically connected to the first binding terminal 11, so as to electrically connect the display assembly 2 with the driving backplane 1. Furthermore, the driving backplane 1 is further provided with a driving chip (not shown in the drawing), and the second binding terminal 50 is further electrically connected to the driving chip to transmit the driving signal of the driving chip to a corresponding display component 2.

In this way, by configuring peripheral circuits such as a driving chip on the driving backplane 1, and configuring a deep hole and the first binding terminal 11 on each of the display components 2, a respective signal line in the display component 2 is electrically connected to the first binding terminal 11 through the deep hole and connected to the driving chip through a corresponding second binding terminal 50, so as to achieve signal transmission. Thus, each of the display components 2 does not need to reserve a frame area to configure a driving chip and various binding trace, so that there is no large splicing gap between adjacent two display components 2 after the display components 2 is spliced.

Furthermore, the first binding terminal 11 is provided to include two portions of the first terminal portion 111 and a plurality of second terminal portions 112, the first terminal portion 111 provided on the first barrier layer 13, and the second terminal portions 112 provided within the first barrier layer 13. The second terminal portions 112 are provided in dense and spaced columnar structure, one end of each of the second terminal portions 112 is electrically connected with the first terminal portion 111, and the other end of each of the second terminal portion 112 is electrically connected with the driving backplane 1. In this way, while achieving the binding of the display components 2 and the driving backplane 1, it can further reduce the damage to the second terminal 112 when laser drilling, and improve the reliability of the binding of the first binding terminal 11 with the driving backplane 1, so as to solve the problem that display the screen and the motherboard have malfunction joints existing in the conventional seamless spliced display technologies.

Figure 5:
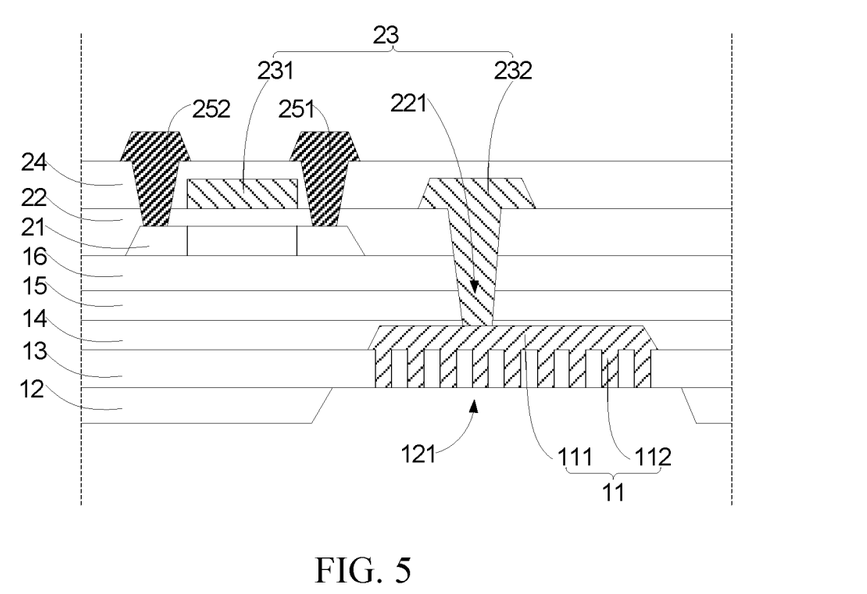
FIG. 5 is a third schematic partial sectional structural view of display components provided by an embodiment of the present application.

In one embodiment, please refer to FIGS. 1 to 5. FIG. 5 is a schematic diagram of the third partial sectional structure of the display assembly provided by the embodiment of the present application. Different from the above embodiments, the gate scanning line 232 is directly electrically connected with a corresponding first terminal 111. Therefore, it is not necessary to configure a signal transfer line 254 in the source electrode and drain electrode layer 25. Specifically, the gate insulating layer 22 is patterned to form a fourth via 221, which penetrates through the gate insulating layer 22, the buffer layer 16, the second barrier layer 15, and the second substrate 14 to the first terminal portion 111 to expose a portion of the first terminal portion 111. The gate scanning line 232 is electrically connected to the first terminal portion 111 through the fourth via 221. For other descriptions, refer to the above embodiments, and the descriptions will not be repeated here again.

Figure 6:
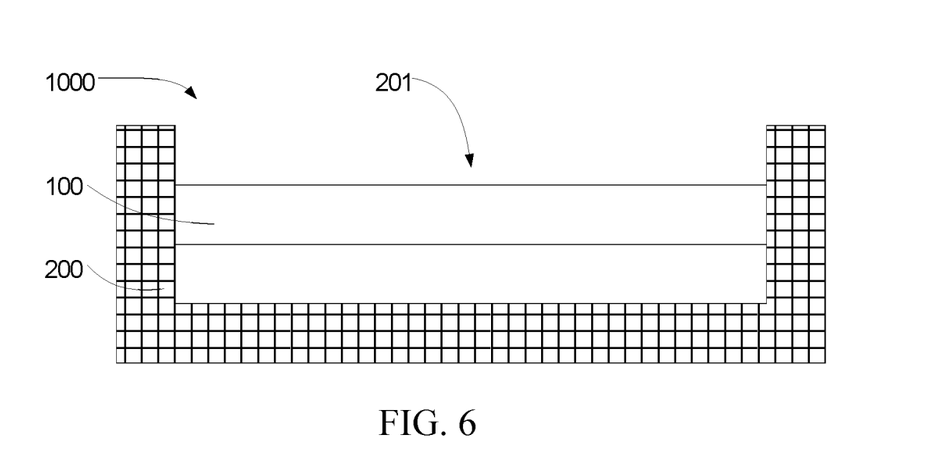
FIG. 6 is a schematic sectional structural view of a display device provided by an embodiment of the present application.

In an embodiment of the present application, refer to FIG. 6, FIG. 6 is a schematic sectional structural view of a display device provided by an embodiment of the present application. The display device 1000 includes a casing 200 and a display panel 100 according to one of the above embodiments, the casing 200 forms a accommodating cavity 201, and the display panel 100 is provided in the accommodating cavity 201.

According to the above embodiment, the present application provides a display panel and a display device, the display panel includes a driving backplane and a plurality of display components are arranged in an array on a driving backplane, each of the display components including a substrate and a plurality of first binding terminals, each of the first binding terminals including a first terminal portion and a plurality of second terminal portions, the first terminal portion provided at a side of the substrate away from the driving backplane, the second terminal portions provided within the substrate, one end of each of the second terminal portions electrically connected to the first terminal, and the other end of each of the second terminals electrically connected to the driving backplane, and an orthographic projection area of the second terminals projected on the substrate is smaller than an orthographic projection area of the first terminal projected on the substrate. The second terminal portion is arranged in a dense and spaced columnar structure, which reduces the damage to the second terminals during the laser drilling and improves the reliability of binding the first binding terminal to the driving backplane, so as to solve the problem that display the screen and the motherboard have malfunction joints existing in the conventional seamless spliced display technologies.

In the above embodiments, the description of each embodiment has its own focus, and the parts that are not described in detail in a particular embodiment can be found in the relevant descriptions of other embodiments.

The above embodiments have been described in detail, and specific examples have been applied in this text to illustrate the principles and implementation of the present application. The above embodiments are described only to help understand the technical solution of this application and its core ideas. A person of ordinary skill in the art should understand that he is still possible to modify the technical solution described in the above embodiments, or to replace some of the technical features. And these modifications or replacements do not make the essence of the corresponding technical solutions out of the scope of the technical solutions of the embodiments of the present application.

What is claimed is:

1. A display panel, comprising a driving backplane, and a plurality of display components electrically connected to the driving backplane, wherein the display components comprise:
   a substrate provided facing the driving backplane; and
   a plurality of first binding terminals, each of the first binding terminals comprising a first terminal portion and a plurality of second terminal portions, wherein the first terminal portion is provided at a side of the substrate away from the driving backplane, and the second terminal portions are provided in the substrate;
   wherein one end of each of the second terminal portions is electrically connected to the first terminal portion, the other end of each of the second terminal portions is electrically connected to the driving backplane, and an orthographic projection area of the second terminal portions projected on the substrate is smaller than an orthographic projection area of the first terminal portion projected on the substrate.

2. The display panel according to claim 1, wherein the substrate comprises a first substrate and a first barrier layer provided at a side of the first substrate away from the driving backplane, wherein the first terminal portion is provided at a side of the first barrier layer away from the first substrate, the second terminal portions are provided in the first barrier layer, and the first substrate is provided with an opening corresponding to the first terminal portion.

3. The display panel according to claim 2, wherein the first barrier layer is provided with a plurality of through holes at intervals in an area corresponding to the first terminal portion, and each of the second terminal portions is filled in a corresponding through hole.

4. The display panel according to claim 3, wherein a size of the through hole ranges from 2 microns to 5 microns.

5. The display panel according to claim 2, wherein a size of the opening is greater than or equal to a size of the first terminal portion.

6. The display panel according to claim 5, wherein the size of the first terminal portion is greater than 100 microns.

7. The display panel according to claim 1, wherein the display components further comprise a driving circuit layer provided at a side of the first binding terminal away from the substrate, and the driving circuit layer comprises a plurality of signal traces electrically connected to a corresponding first terminal portion.

8. The display panel according to claim 7, wherein the substrate further comprises an insulating protection layer covering the first terminal portion and the first barrier layer, and the driving circuit layer comprises:
   a semiconductor layer provided on the insulating protection layer;
   a gate insulating layer covering the semiconductor layer and the insulating protection layer;
   a gate electrode layer provided on the gate insulating layer, and the gate electrode layer comprising a gate electrode and a gate signal scanning line;
   an interlayer insulating layer covering the gate electrode layer and the gate insulating layer; and
   a source electrode and drain electrode layer disposed on the interlayer insulating layer, and the source electrode and drain electrode layer comprising a source electrode, a drain electrode and a data line;
   wherein the signal traces comprise gate signal line and the data line.

9. The display panel according to claim 1, wherein the first terminal portion and the second terminal portions are integrally provided as a whole.

10. The display panel according to claim 1, wherein a second binding terminal is provided at a side of the driving backplane facing the display components, and the second binding terminal is electrically connected to the second terminal portion.

11. The display panel according to claim 10, wherein a number of the display components is multiple, and the display components are arranged on the driving backplane in an array.

12. A display device, comprising:
   a casing formed with an accommodating cavity;
   wherein the display panel is arranged within the accommodating cavity, and the display panel comprises a driving backplane, and a plurality of display components electrically connected to the driving backplane, wherein the display components comprise:
   a substrate provided facing the driving backplane; and
   a plurality of first binding terminals, each of the first binding terminals comprising a first terminal portion and a plurality of second terminal portions, wherein the first terminal portion is provided at a side of the substrate away from the driving backplane, and the second terminal portions are provided in the substrate;
   wherein one end of each of the second terminal portions is electrically connected to the first terminal portion, the other end of each of the second terminal portions is electrically connected to the driving backplane, and an orthographic projection area of the second terminal portions projected on the substrate is smaller than an orthographic projection area of the first terminal portion projected on the substrate.

13. The display device according to claim 12, wherein the substrate comprises a first substrate and a first barrier layer provided at a side of the first substrate away from the driving backplane, wherein the first terminal portion is provided at a side of the first barrier layer away from the first substrate, the second terminal portions are provided in the first barrier layer, and the first substrate is provided with an opening corresponding to the first terminal portion.

14. The display device according to claim 13, wherein the first barrier layer is provided with a plurality of through holes at intervals in an area corresponding to the first terminal portion, and each of the second terminal portions is filled in a corresponding through hole.

15. The display device according to claim 14, wherein a size of the through hole ranges from 2 microns to 5 microns.

16. The display device according to claim 13, wherein a size of the opening is greater than or equal to a size of the first terminal portion.

17. The display device according to claim 16, wherein the size of the first terminal portion is greater than 100 microns.

18. The display device according to claim 12, wherein the display components further comprise a driving circuit layer provided at a side of the first binding terminal away from the substrate, and the driving circuit layer comprises a plurality of signal traces electrically connected to a corresponding first terminal portion.

19. The display device according to claim 18, wherein the substrate further comprises an insulating protection layer covering the first terminal portion and the first barrier layer, and the driving circuit layer comprises:
    a semiconductor layer provided on the insulating protection layer;
    a gate insulating layer covering the semiconductor layer and the insulating protection layer;
    a gate electrode layer provided on the gate insulating layer, and the gate electrode layer comprising a gate electrode and a gate signal scanning line;
    an interlayer insulating layer covering the gate electrode layer and the gate insulating layer; and
    a source electrode and drain electrode layer disposed on the interlayer insulating layer, and the source electrode and drain electrode layer comprising a source electrode, a drain electrode and a data line;
wherein the signal traces comprise gate signal line and the data line.

20. The display device according to claim 12, wherein the first terminal portion and the second terminal portions are integrally provided as a whole.

* * * * *